(12) United States Patent
Engelen

(10) Patent No.: US 11,677,216 B2
(45) Date of Patent: Jun. 13, 2023

(54) LIGHT-EMITTING DEVICE

(71) Applicant: Lumileds LLC, San Jose, CA (US)

(72) Inventor: Rob Jacques Paul Engelen, Eindhoven (NL)

(73) Assignee: LUMILEDS LLC, San Jose, CA (US)

( * ) Notice: Subject to any disclaimer, the term of this patent is extended or adjusted under 35 U.S.C. 154(b) by 285 days.

(21) Appl. No.: 16/774,824

(22) Filed: Jan. 28, 2020

(65) Prior Publication Data

US 2020/0358256 A1     Nov. 12, 2020

(30) Foreign Application Priority Data

May 9, 2019 (EP) ..................................... 19173445

(51) Int. Cl.
*H01S 5/42* (2006.01)
*H01S 5/042* (2006.01)
*H01S 5/183* (2006.01)

(52) U.S. Cl.
CPC .......... *H01S 5/423* (2013.01); *H01S 5/04256* (2019.08); *H01S 5/18344* (2013.01); *H01S 5/18361* (2013.01)

(58) Field of Classification Search
CPC .. H01S 5/423; H01S 5/04256; H01S 5/18344; H01S 5/18361
See application file for complete search history.

(56) References Cited

U.S. PATENT DOCUMENTS

| | | | |
|---|---|---|---|
| 2005/0019973 A1* | 1/2005 | Chua | H01S 5/423 438/42 |
| 2006/0285568 A1* | 12/2006 | Watanabe | H01S 5/18311 372/108 |
| 2008/0205459 A1 | 8/2008 | Yonekubo | |
| 2019/0097397 A1 | 3/2019 | Yuen et al. | |
| 2019/0222002 A1* | 7/2019 | Barve | H01S 5/18311 |

FOREIGN PATENT DOCUMENTS

| | | |
|---|---|---|
| CN | 107039885 A | 8/2017 |
| DE | 102011085340 A1 | 5/2013 |
| DE | 102011085344 A1 | 5/2013 |
| EP | 2645495 A2 | 10/2013 |
| WO | 2014/087301 A1 | 6/2014 |

* cited by examiner

*Primary Examiner* — Yuanda Zhang
(74) *Attorney, Agent, or Firm* — Volpe Koenig

(57) ABSTRACT

A light-emitting device comprising VCSELs formed in a die. The VCSEL distribution is characterized by an essentially linear decrease in VCSEL density over the die from a highest VCSEL density in a first die region to a lowest VCSEL density in another die region. The VCSELs share a common anode and a common cathode for collective switching of the plurality of VCSELs. A method of manufacturing such a VCSEL die is also described.

20 Claims, 3 Drawing Sheets

LIGHT-EMITTING DEVICE

CROSS REFERENCE TO RELATED APPLICATION(S)

This application claims the benefit of EP Patent Application 19173445.8, filed on May 9, 2019, which is incorporated by reference as if fully set forth.

FIELD OF INVENTION

The invention describes a light-emitting device and a method of manufacturing a VCSEL die.

BACKGROUND

Developments in the manufacture of VCSEL (vertical cavity surface-emitting laser) arrays have made these devices interesting as an alternative to LEDs for various kinds of applications, for example in a camera flash application. The characteristic features of VCSELs also make VCSEL arrays useful for other applications such as LIDAR, projection, optical heterodyne detection, etc. However, one of the main disadvantages of a VCSEL array is speckle, i.e. an intensity pattern produced by the mutual interference of the set of wavefronts reflected from the object illuminated by the VCSEL array light source. A speckle pattern typically occurs when light with a long coherence length is scattered from the illuminated object in a random and varying interference pattern. A speckle pattern can be created when light from a VCSEL array is reflected off white paint or paper, for example.

A speckle pattern can be described by its contrast ratio, i.e. the ratio of the standard deviation of the intensity levels and the mean value of the intensity levels. A speckle contrast ratio exceeding 1% can be perceived by the human eye. In applications such as projection systems, speckle is undesirable since it can significantly reduce image quality and can cause the viewer to experience eye fatigue. In machine vision, speckle will appear as an additional source of noise in images.

To avoid speckle, there are various possible approaches. For example, a diffusing element can be placed over a VCSEL array in order to scatter the light before it arrives at the object. However, a diffusing element is always associated with a loss of light. In another approach, the current to the VCSELs of the array can be modulated with the aim of reducing the modal coherence of the light leaving the die. Both approaches result in a dynamic speckle pattern that can be averaged by a camera system, hence reducing the perceived speckle. Alternatively, the light source can comprise several VCSEL dies, manufactured to emit light at different wavelengths. Any of these approaches that aim to reduce the severity of a speckle pattern by reducing the spatial, modal, or chromatic coherence of the VCSEL light sources are expensive and/or result in a loss of light.

US 2019/097397 A1 discloses an emitter array with variable spacing between adjacent pairs of first and second emitters to reduce thermal or optical non-uniformity. US 2008/0205459 A1 discloses a light source device including a plurality of light emission sections disposed in parallel with an interval. The interval near each end portion in an array of light emission sections is narrower than the interval near a centre portion.

Therefore, it is an object of the invention to provide an alternative way of reducing or eliminating a speckle pattern.

SUMMARY

The object of the invention is achieved by the light-emitting device of claim 1, and by the method of claim 12 of method of manufacturing a VCSEL die.

According to the invention, the light-emitting device comprises a plurality of VCSELs formed in a die, and wherein the VCSEL distribution is characterized by an essentially linear decrease in VCSEL density over the die from a highest VCSEL density in a first die region to a lowest VCSEL density in another die region, and wherein the plurality of VCSELs shares a common cathode and a common anode for collective switching of the plurality of VCSELs. The VCSELs are formed to give an essentially linear increase in VCSEL diameter from the die region of greatest density to the die region of least density.

In the context of the invention, this essentially linear decrease in VCSEL density over the die is to be understood as a gradual decrease in VCSEL density from the highest VCSEL density region to the lowest VCSEL density region.

The invention is based on the insight that the thermal characteristics of the VCSELs within an array can be exploited to significantly reduce speckle. The inventor has investigated changes in the spectral properties of a prior art VCSEL array comprising a regular arrangement of identical VCSELs, for example a hexagonal VCSEL array with uniform pitch. The VCSELs of such an array have the same size and shape, and are essentially identical in power, spectral width and peak wavelength of emitted light. However, the inventor has observed that the spectral properties of the ensemble will change according to the array temperature, and has realised that this temperature dependency can be used to good effect. Unlike prior art design approaches, which are based on an even distribution of VCSELs in an array to ensure a corresponding even temperature distribution, the inventive VCSEL device deliberately introduces a density gradient to actively encourage the development of a distinct temperature differences in the VCSEL array. Since the VCSELs are all turned on simultaneously (they share a common cathode and a common anode) the density distribution leads to the development of "hotter" regions and "cooler" regions over the die. The inventor has realised that the increase in peak wavelength shift in the light leaving a hotter VCSEL array region will actually lead to a reduction or even an elimination of the speckle pattern. This is because the greater mix of wavelengths arriving at the object means that there is less likelihood of coherent wavefronts augmenting or cancelling each other out in the light perceived by the viewer or received by the image sensor of a camera.

According to the invention, the method of manufacturing a VCSEL die for use in such a light-emitting device comprises the steps of allocating a region of the die to a highest VCSEL density; allocating a region of the die to a lowest VCSEL density; forming a plurality of VCSELs over the die with an essentially linear decrease in VCSEL density from the highest VCSEL density region to the lowest VCSEL density region; and providing a common cathode and a common anode for collective switching of the plurality of VCSELs.

An advantage of the inventive method is that it results in a VCSEL die that is effective in reducing speckle, while being favourably economical to manufacture. The only alteration to an existing VCSEL die design is the non-uniform density distribution of the VCSELs. It is not necessary to make costly alterations to the layer deposition steps, for example, and the semiconductor layers can be deposited using an already established sequence. The only alteration to the manufacturing sequence is a step of providing masks that define the positions of the channels through the implanted regions and the aperture sites in the anode. Instead of using masks that determine a uniform VCSEL pitch over the die, the masks will define a gradual increase in VCSEL pitch from a highest VCSEL density region towards a lowest VCSEL density region.

The dependent claims and the following description disclose particularly advantageous embodiments and features of the invention. Features of the embodiments may be combined as appropriate. Features described in the context of one claim category can apply equally to another claim category.

A VCSEL die is formed by depositing semiconductor layers in a well-defined manner to obtain an active layer sandwiched between two distributed Bragg reflector mirrors. One face will be the emission face, and the individual VCSELs are formed by depositing suitably shaped metal contacts onto the emission face. In addition, the metal contacts are isolated from the active layer, except around the VCSEL apertures.

In the following, but without restricting the invention in any way, it may be assumed that the VCSEL die comprises many VCSELs, preferably at least 50. For example, a VCSEL die with dimensions in the order of 1.0 mm$^2$ may comprise 400 or more VCSELs. A VCSEL die may be assumed to be one of many dies obtained by dicing a corresponding wafer.

The non-uniform density distribution of the VCSELs can be achieved by an essentially linear reduction in VCSEL density from a highest VCSEL density region towards a lowest VCSEL density region. One way of achieving such a distribution may be to arrange VCSELs at a highest density towards one side of the die, and to gradually decrease the VCSEL density in the direction of the other side of the die. Of course, the decrease in density across the die need not be linear, i.e. with a constant "rate" of reducing density, and the rate of reduction in VCSEL density may be relatively "slow" in a highest density region, and may be more rapid in a lower density region.

A favourable reduction in speckle can be achieved by forming the VCSELs in the different regions so that there is a significant difference between the greatest VCSEL density and the lowest VCSEL density. In a particularly preferred embodiment of the invention, the VCSEL density in a die region of greatest density comprises up to 1,500 VCSELs per mm$^2$. The VCSEL density in a die region of least density comprises at most 400 VCSELs per mm$^2$, more preferably at most 300 VCSELs per mm$^2$, most preferably at most 200 VCSELs per mm$^2$. The invention is based on the insight that the peak wavelength of the VCSELs in a VCSEL array will shift towards a longer wavelength if the temperature of the VCSEL array increases, and the invention puts this knowledge to use by densely arranging VCSELs in one or more regions of the VCSEL array, and having less dense arrangement of VCSELs in or more other regions. The more densely packed VCSELs will become hotter than the less densely packed VCSELs, even though all VCSELs are formed on the same die, and even though the VCSELs may be identical. The light leaving the die will therefore be a mix of slightly different wavelengths, and the light reflected from the object or scene will therefore exhibit a significant reduction in speckle, and possibly an almost complete elimination of speckle. In a preferred embodiment of the invention, the non-uniform density distribution is chosen on the basis of a desired peak wavelength shift between a region of greatest density and a region of least density. Preferably, the peak wavelength shift between a region of greatest density and a region of least density comprises at least 3 nm, more preferably at least 5 nm. The resulting speckle contrast ratio may be in the order of 5% or less, which compares very favourably to the significantly more expensive prior art solutions that aim to reduce speckle.

The VCSEL array may have various possible structures, i.e. there are various ways in which to organise the VCSELs to achieve the desired effect. For example, if the VCSELs each have an essentially hexagonal shape, it may be convenient to distribute the VCSELs in an essentially hexagonal pattern, whereby the pitch between adjacent VCSELs is smallest in the highest density region and largest in the lowest density region.

Equally, the die regions can be "nested", for example the VCSELs may be arranged in an essentially annular fashion, for example with the highest density region at the outer edges of the die, and the lowest density region in the centre of the die, or vice versa.

If the diameter of a VCSEL is made smaller, energy is channeled through a smaller area, so that the VCSEL will become hotter during operation. To exploit this effect, according to the invention, the sizes of the VCSELs are adapted to the different density regions. The VCSEL diameter is smallest for the VCSELs in a highest density region. Therefore, in a preferred embodiment of the invention, the diameter of a VCSEL in a highest density region may be as small as 5 μm. The diameter of a VCSEL in a lowest density region may be in the order of 10 μm.

Other objects and features of the present invention will become apparent from the following detailed descriptions considered in conjunction with the accompanying drawings. It is to be understood, however, that the drawings are designed solely for the purposes of illustration and not as a definition of the limits of the invention.

BRIEF DESCRIPTION OF THE DRAWING(S)

In the drawings, like numbers refer to like objects throughout. Objects in the diagrams are not necessarily drawn to scale.

DETAILED DESCRIPTION OF THE PREFERRED EMBODIMENT(S)

Figure 1:
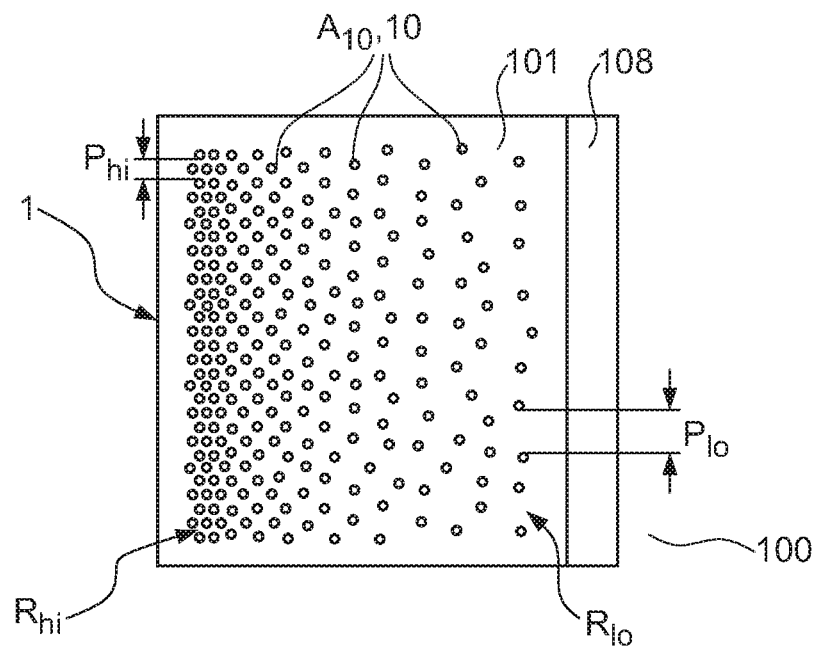
FIG. 1 shows an embodiment of the inventive VCSEL device.

FIG. 1 shows an embodiment of the inventive VCSEL device 1. The VCSEL device 1 (or "VCSEL array") is realised as a die 100 with multiple VCSELs 10 formed at specific positions, and a wire bond bad 108 to one side. Each VCSEL 10 is identified by the corresponding aperture $A_{10}$ in the electrode 101 deposited on the emission face of the die 100. The electrode 101 in this embodiment is a common anode 101, and a common cathode may be formed on the underside of the die 1. The dimensions of this exemplary die 100 can be 1.0×1.0 mm, and each aperture $A_{10}$ can have a diameter as small as 10 μm. The diagram can only show a relatively small number of VCSELs 10, and it shall be understood that the array may comprise hundreds of VCSELs, possibly also in excess of 1,000 VCSELs.

Instead of a regular distribution of VCSELs over the surface of the die 100, the approach taken by the invention is to form the VCSELs 10 in regions of different densities. This exemplary embodiment illustrates a high-density region $R_{hi}$ on the left, and a low-density region $R_{lo}$ on the right. In the high-density region $R_{hi}$, the VCSELs 10 are arranged in a very dense configuration, indicated by the dense arrangement of apertures $A_{10}$. In the low-density region $R_{lo}$, the VCSELs 10 are distributed in a sparse configuration.

The density of the VCSELs 10 gradually reduces with increasing distance from high-density region towards the low-density region. For example, VCSELs 10 can be distributed with a density $D_{hi}$ of 1,500 VCSELs per $mm^2$ in the high-density region $R_{hi}$, decreasing gradually towards a density $D_{lo}$ of only 300 VCSELs per $mm^2$ in the low-density region $R_{lo}$. Therefore, the smallest pitch $P_{hi}$ (i.e. distance between adjacent VCSELs) is found in the high-density region $R_{hi}$, and the largest pitch $P_{lo}$ is found in the low-density region $R_{lo}$. It shall be noted that the decrease in density applies to both the X-axis and the Y-axis, so that the maximum and minimum pitch $P_{hi}$, $P_{lo}$ apply in both vertical and horizontal directions in this diagram.

Figure 2:
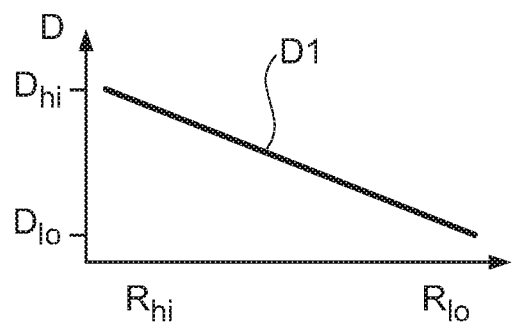
FIG. 2 shows the VCSEL density distribution in the embodiment of FIG. 1.

FIG. 2 shows a graph D1 of density D against distance along the die 100 for the embodiment of FIG. 1, showing that the rate of reduction in VCSEL density is linear.

Figure 3:
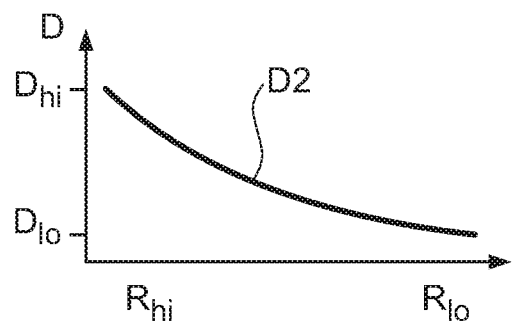
FIG. 3 shows alternative VCSEL density distributions.

FIG. 3 shows a graph D2 of density D against distance along the die for a further exemplary embodiment in which the VCSELs are formed in the die such that the rate of reduction in VCSEL density is not clearly linear.

Figure 4:
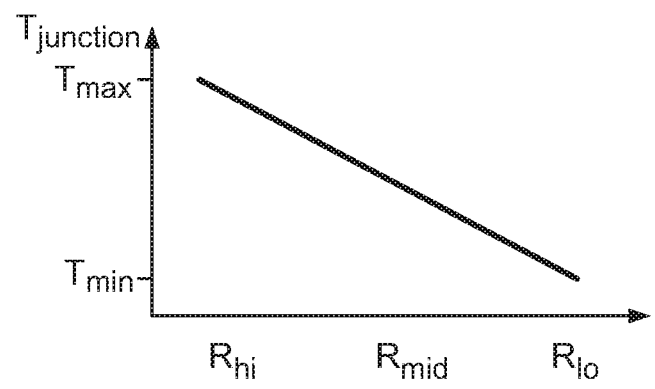
FIG. 4 shows junction temperature in the embodiment of FIG. 1.

FIG. 4 shows a corresponding graph of junction temperature $T_{junction}$ against distance along the die. This can be inferred from knowledge of the development of junction temperature in VCSELs of the type used in the array 1. In the closely-packed region $R_{hi}$, there is limited space for heat to dissipate from the individual VCSELs 10, each one also being heated by its close neighbours. With decreasing density towards the sparsely-packed-packed region $R_{lo}$, heat is better able to dissipate from the individual VCSELs 10, so that they have less effect on the junction temperatures of their neighbours. While the various junction temperatures cannot be observed directly, the large difference in junction temperatures in the closely-packed region and the sparsely-packed region may be observable as a slight temperature gradient on the bottom side of the die (a VCSEL array die with a uniform distribution of VCSELs would have an essentially even temperature spread across its underside).

Figure 5:
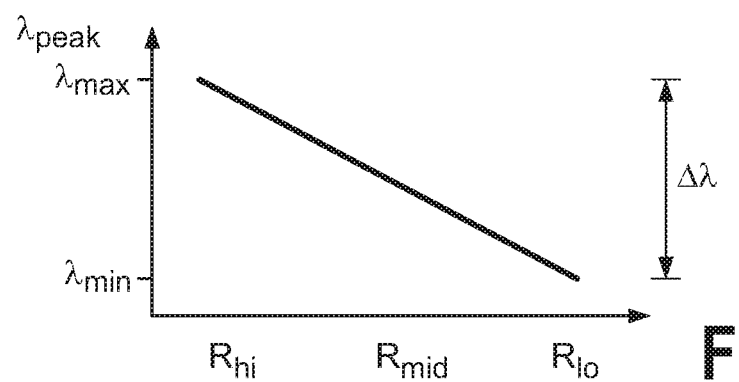
FIG. 5 shows peak wavelength shift in the embodiment of FIG. 1.

At the side of the die with highest VCSEL density $R_{hi}$, the junction temperature $T_{junction}$ will also be highest during operation of the device. At the side of the die with lowest VCSEL density $R_{lo}$, the junction temperature $T_{junction}$ will also be lowest. As explained above, the peak wavelength of the light emitted by a VCSEL will increase (i.e. shift towards longer wavelengths) with increasing junction temperature. FIG. 5 shows a graph of peak wavelength $\lambda_{peak}$ against distance along the die. The diagram shows that the VCSELs that are most closely packed in the high-density region $R_{hi}$ will also emit light at longer wavelengths than the less densely-packed VCSELs in the low-density region $R_{lo}$. The peak wavelength $\lambda_{max}$ of the light emitted by the more closely-packed VCSELs in the high-density region $R_{hi}$ can be shifted by up to 5 nm relative to the peak wavelength $\lambda_{min}$ of the light emitted by the loosely-packed VCSELs in the low-density region $R_{lo}$. The densities of the VCSELs in the die regions $R_{hi}$, $R_{lo}$ and the relative sizes of the die regions can be chosen to achieve a desired peak wavelength shift $\Delta\lambda$.

Figure 6:
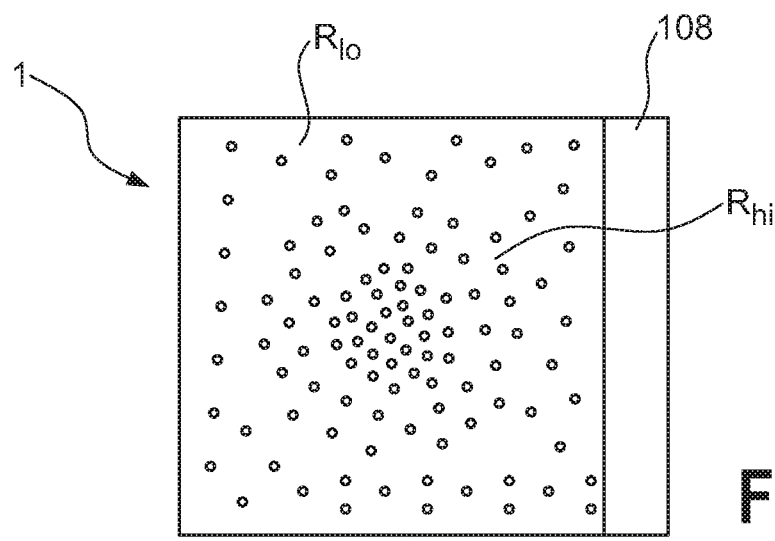
FIG. 6 shows a further embodiment of the inventive VCSEL device.

FIG. 6 shows an alternative embodiment of the inventive VCSEL device 1, in which the VCSEL density increases towards the centre of the die 100. Of course, the opposite arrangement is also possible, in which the VCSEL density decreases towards the centre of the die 100.

Figure 7:
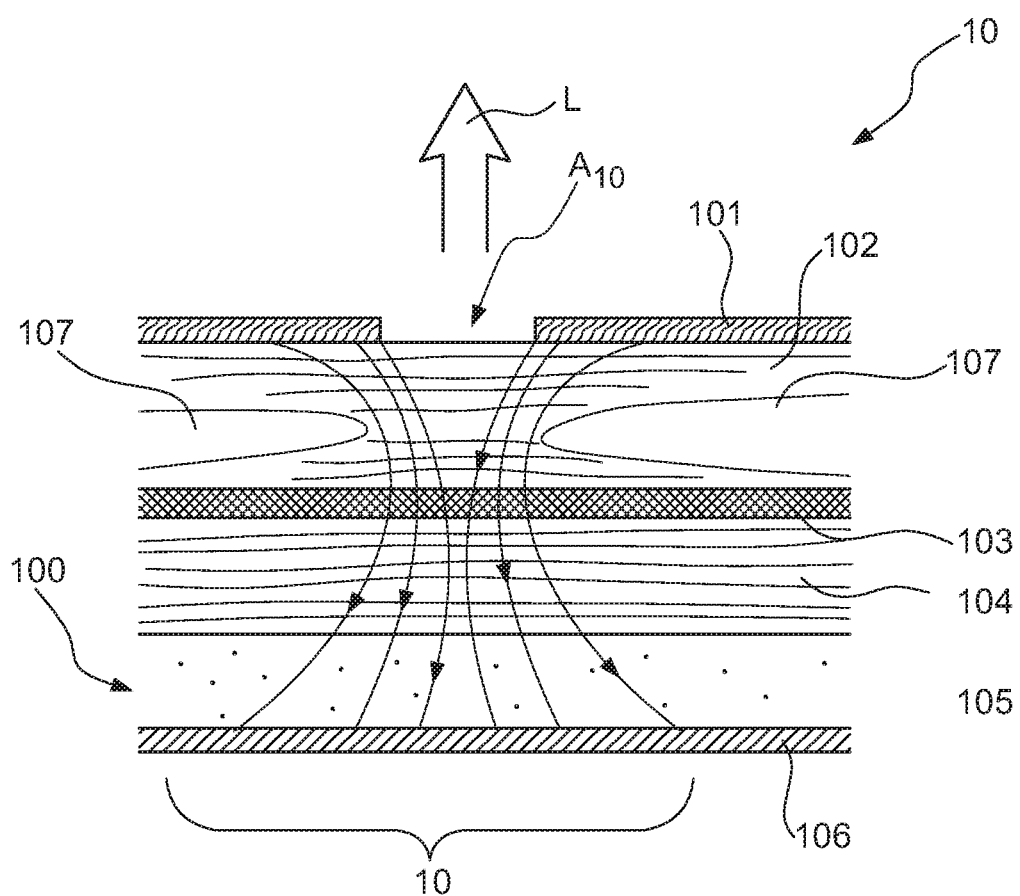
FIG. 7 shows a cross-section through an embodiment of a VCSEL device.

FIG. 7 shows a cross-section through an embodiment of a VCSEL device 1 and illustrates the structure of a VCSEL 10 in one region of the die 100. The VCSEL device 1 essentially comprises an active layer 103 sandwiched between two DBR layers 102, 104. These layers 102, 103, 104 are formed on a substrate 105, and an electrode 106 is applied onto the base of the substrate 105. The upper DBR 102 includes an implanted region 107 shaped to leave a channel that defines a path for electric current, as indicated by the arrows. An electrode 101 is applied to the top of the upper DBR 102 and shaped to leave an aperture $A_{10}$ above the channel in the implanted region 107. During operation of the device 1, light L from this VCSEL 10 is emitted through the aperture $A_{10}$.

In this embodiment, the upper electrode 101 is the anode, and is part of the common anode of the VCSEL array. The lower electrode 106 is the cathode, which is part of the common cathode of the VCSEL array. The order of the layers is as follows: p-DBR 102, active layer 103, n-DBR 104, n-substrate 105.

Figure 8:
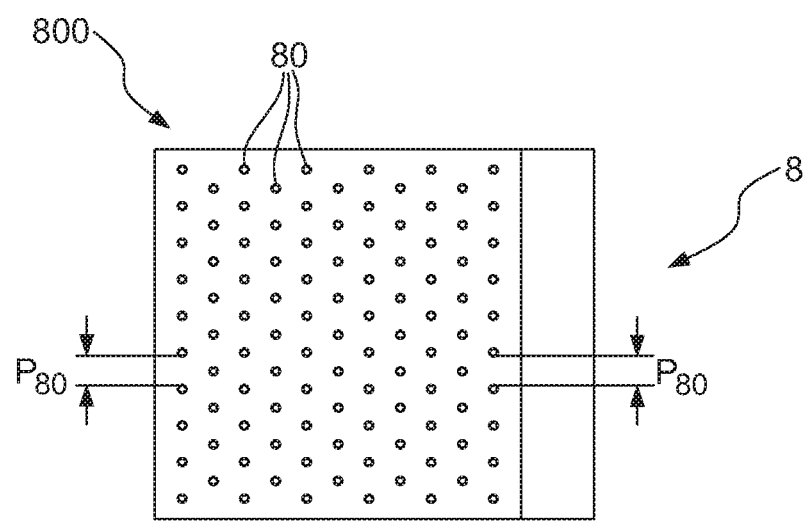
FIG. 8 shows a prior art VCSEL device.

As described above, a prior art VCSEL device 8 as shown in FIG. 8 generally has a uniform array of VCSELs 80 over a die 800, for example a regular hexagonal arrangement of VCSELs 80 with a single pitch $P_{80}$ defining the distance between adjacent VCSELs 80. Because of the regular arrangement of closely-packed VCSELs, the junction temperature is essentially the same for all VCSELs 80. To counteract the speckle pattern that will result from this device 8, additional measures must be taken, for example to arrange a diffuser above the emission face of the VCSEL array.

Although the present invention has been disclosed in the form of preferred embodiments and variations thereon, it will be understood that numerous additional modifications and variations could be made thereto without departing from the scope of the invention.

For the sake of clarity, it is to be understood that the use of "a" or "an" throughout this application does not exclude a plurality, and "comprising" does not exclude other steps or elements.

REFERENCE SIGNS

| | |
|---|---|
| VCSEL device | 1 |
| VCSELs | 10 |
| die | 100 |
| anode | 101 |
| upper DBR | 102 |
| active layer | 103 |
| lower DBR | 104 |
| substrate | 105 |
| cathode | 106 |
| implanted region | 107 |
| wire bond pad | 108 |
| aperture | A |
| light | L |

-continued

| | |
|---|---|
| high-density region | $R_{hi}$ |
| low-density region | $R_{lo}$ |
| smallest pitch | $P_{hi}$ |
| largest pitch | $P_{lo}$ |
| density | D |
| highest density | $D_{hi}$ |
| lowest density | $D_{lo}$ |
| junction temperature | $T_{junction}$ |
| highest temperature | $T_{hi}$ |
| lowest temperature | $T_{lo}$ |
| peak wavelength | $\lambda_{peak}$ |
| max peak wavelength | $\lambda_{max}$ |
| min peak wavelength | $\lambda_{min}$ |
| desired peak wavelength shift | $\Delta\lambda$ |
| prior art device | 8 |
| VCSEL | 80 |
| uniform pitch | $P_{80}$ |
| die | 800 |

What is claimed is:

1. A light-emitting device comprising:
a die;
an anode on the die;
a cathode on the die; and
a plurality of vertical cavity surface-emitting lasers (VCSELs) in the die in a VCSEL distribution with a VCSEL density of the plurality of VCSELs over the die essentially linearly decreasing from a highest VCSEL density in a first die region to a lowest VCSEL density in a second die region and a diameter of the plurality of VCSELs essentially linearly increases from the first die region having the highest VCSEL density to the second die region having the lowest VCSEL density,
each of the plurality of VCSELs are electrically coupled to the anode and the cathode.

2. The light-emitting device according to claim 1, wherein the first die region and the second die region are at opposite ends of the die.

3. The light-emitting device according to claim 1, wherein the first die region and the second die region are essentially annular in shape.

4. The light-emitting device according to claim 3, wherein the first die region is along edges of the die and the second die region is in a center of the die.

5. The light-emitting device according to claim 3, wherein the first die region is in a center of the die and the second die region is along edges of the die.

6. The light-emitting device according to claim 1, wherein the VCSEL density in the first die region is at least 600 VCSELs per mm².

7. The light-emitting device according to claim 1, wherein the VCSEL density in the first die region is at least 1000 VCSELs per mm².

8. The light-emitting device according to claim 1, wherein the VCSEL density in the first die region is at least 1,500 VCSELs per mm².

9. The light-emitting device according to claim 1, wherein the VCSEL density in the second die region is at most 400 VCSELs per mm².

10. The light-emitting device according to claim 1, wherein the VCSEL density in the second die region is at most 200 VCSELs per mm².

11. The light-emitting device according to claim 1, wherein the VCSEL density in the second die region is at most 100 VCSELs per mm².

12. The light-emitting device according to claim 1, wherein the diameter of VCSELs of the plurality of VCSELs in the first die region is in a range of 6 μm-8 μm.

13. The light-emitting device according to claim 1, wherein the diameter of VCSELs of the plurality of VCSELs in the second die region is in a range of 10 μm-15 μm.

14. The light-emitting device according to claim 1, wherein the plurality of VCSELs are arranged in the die in an essentially regular arrangement.

15. The light-emitting device according to claim 14, wherein the essentially regular arrangement is an essentially hexagonal array.

16. The light-emitting device according to claim 1, wherein the die comprises:
a first distributed Bragg reflector mirror,
a second distributed Bragg reflector mirror, and
an active region between the first distributed Bragg reflector mirror and the second distributed Bragg reflector mirror.

17. A method of manufacturing a vertical cavity surface-emitting laser (VCSEL) die, the method comprising:
allocating a first region of the VCSEL die to a highest VCSEL density;
allocating a second region of the VCSEL die to a lowest VCSEL density;
forming a plurality of VCSELs over the VCSEL die with an essentially linear decrease in VCSEL density from the first region to the second region and an essentially linear increase in diameter of the plurality of VCSELs from the first region having the highest VCSEL density to the second region having the lowest VCSEL density; and
electrically coupling the plurality of VCSELs to a common cathode and a common anode.

18. The method according to claim 17, wherein the forming the plurality of VCSELs comprises depositing a plurality of metal contacts shaped to define an aperture on an emission face of the VCSEL die.

19. The method according to claim 17, wherein the forming the plurality of VCSELs further comprises forming respective VCSELs of the plurality of VCSELs in the first region with a density of at most 40 μm.

20. The method according to claim 17, wherein the forming the plurality of VCSELs further comprises forming respective VCSELs of the plurality of VCSELs in the second region with a density of at least 50 μm.

* * * * *